United States Patent [19]

Aoki

[11] Patent Number: 5,170,074
[45] Date of Patent: Dec. 8, 1992

[54] MASTER-SLAVE CLOCKED FLIP-FLOP CIRCUIT

[75] Inventor: Yasushi Aoki, Tokyo, Japan

[73] Assignee: NEC Corporation, Japan

[21] Appl. No.: 667,873

[22] Filed: Mar. 12, 1991

[30] Foreign Application Priority Data

Mar. 13, 1990 [JP] Japan ................................. 2-62950
May 10, 1990 [JP] Japan ................................ 2-120287

[51] Int. Cl.$^5$ ...................... H03K 3/29; H03K 3/289
[52] U.S. Cl. ................................. 307/279; 307/289; 307/291; 307/272.2; 377/74; 377/78; 377/79
[58] Field of Search ............ 307/279, 289, 291, 272.2; 372/74, 78–79

[56] References Cited

U.S. PATENT DOCUMENTS

4,703,200 10/1987 Zangara ................................. 377/79

FOREIGN PATENT DOCUMENTS

3428393 2/1986 Fed. Rep. of Germany ........ 377/79

OTHER PUBLICATIONS

"Two phase MOSFET static shift register employee feedback stage resetting" Fisher, IBM Tech. Disc. Bul. vol. 15 No. 6 Nov. 1972.

Primary Examiner—Janice A. Howell
Assistant Examiner—Margaret Rose Wambach
Attorney, Agent, or Firm—Laff, Whitesel, Conte & Saret

[57] ABSTRACT

A flip-flop of a master-slave type of a CMOS structure having no P channel transistor between nodes of the master flip-flop and of the slave flip-flop is provided. Only one P channel MOS transistor is existent in a route of the current controlling a rise time and a trail time of output signals, so that it is possible to function at a high speed.

5 Claims, 5 Drawing Sheets

MASTER-SLAVE CLOCKED FLIP-FLOP CIRCUIT

BACKGROUND OF THE INVENTION

1. Field of the Invention

The present invention relates to a flip-flop of a CMOS type semiconductor integrated circuit, in particular to a flip-flop of a master-slave type for holding logic values in a logical circuit.

2. Description of the Prior Art

Figure 1:
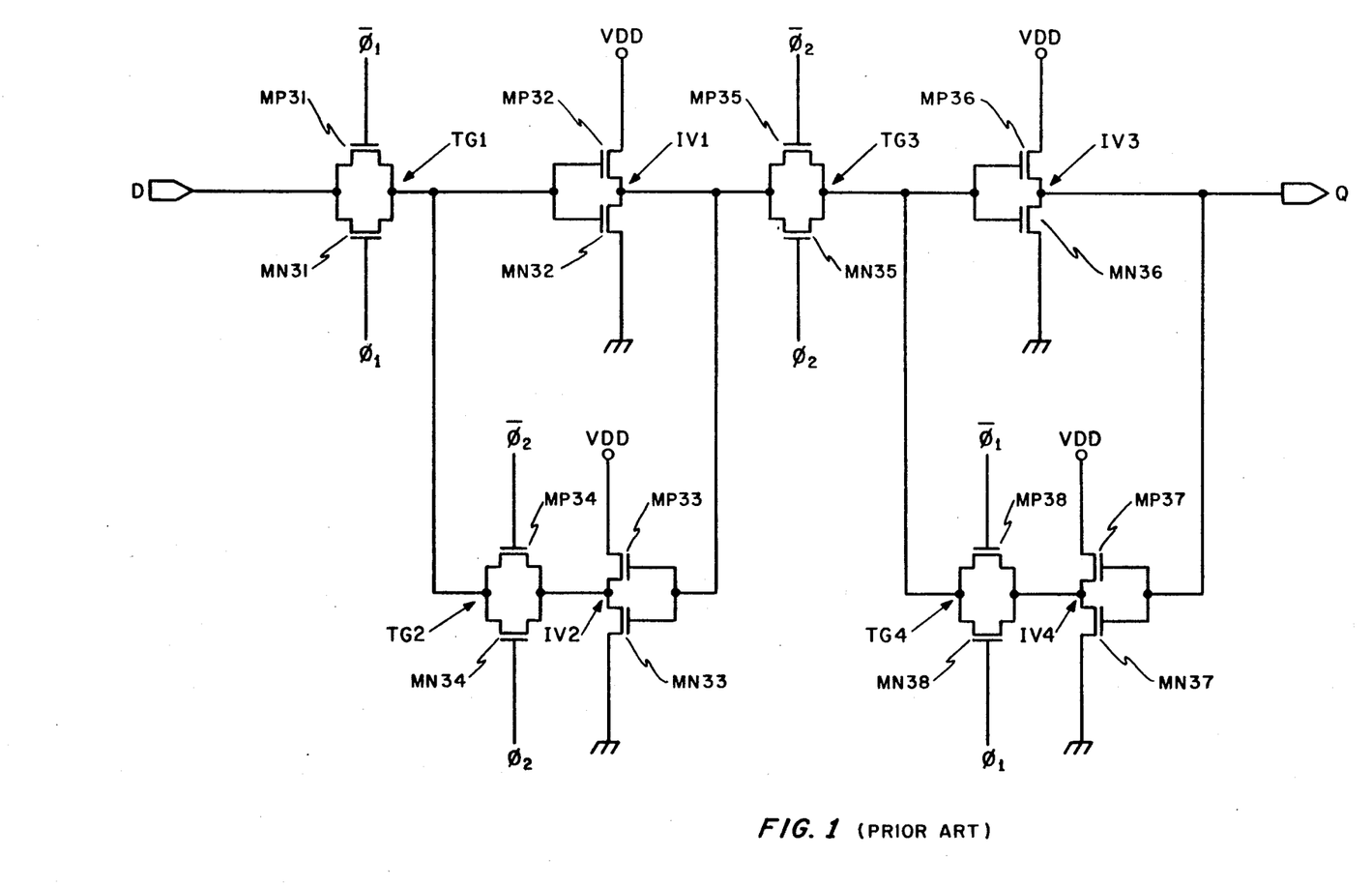
FIG. 1 is a circuitry of the conventional flip-flop circuit.

The conventional flip-flop of a CMOS structure master-slave type shown in FIG. 1 has a first transfer gate TG1 positioned between a data input terminal D and a first CMOS inverter IV1, in which flip-flop an output from the first CMOS inverter IV1 is connected to an input of itself through a second inverter IV2 and a second transfer gate TG2, as well as to a third inverter IV3 through a third transfer gate TG3. An output of the third inverter IV3 is connected to its input through a fourth inverter IV4 and a fourth transfer gate TG4, as well as to a data output terminal Q.

These four transfer gates, of the first to the fourth, respectively consists of a pair of N-channel and P-channel transistors MN31 and MP31, MN34 and MP34, MN35 and MP35 and MN38 and MP38. These four inverters of the first to the fourth, respectively consists of a pair of N-channel and P-channel transistors MN32 and MP32, MN33 and MP33, MN36 and MP36, and MN37 and MP37. Here, MNXX means an N channel MOS transistor and MPXX shows a P channel MOS transistor.

In general, such a CMOS structure semiconductor integrated circuit uses a circuitry structure in which a P channel MOS transistors and N channel MOS transistors are complementarily connected similar to the transfer gates TG1 to TG4 and the inverters IV1 to IV4 above. According to such circuitry structure, when input signals from these inverters have a GND potential or a VDD potential, output signals from these inverters become a VDD potential or a GND potential and the current from VDD to GND is zero. In other words, even when multi-stage of inverters are connected in series, a constant current becomes zero.

In a low current consuming type semiconductor integrated circuit, it is general to use a CMOS logical circuit in which P channel MOS transistors and N channel MOS transistors are complementarily connected. A circuit of a master-slave type flip-flop shown in FIG. 5 has been generally used.

Figure 2A:
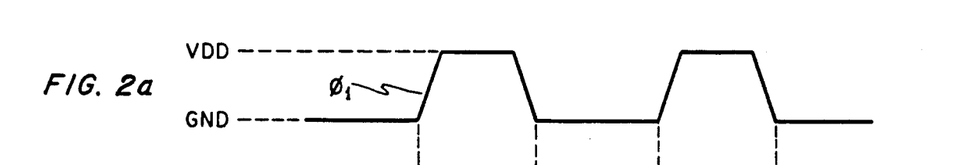
FIGS. 2a to 2d are timing charts of the embodiment shown in FIG. 3.
Figure 2B:
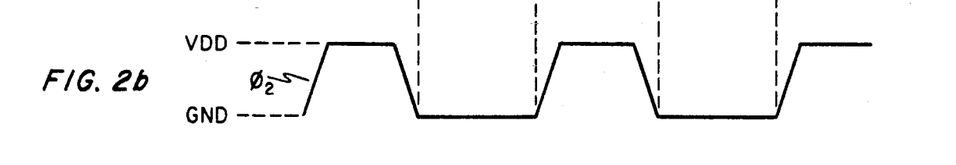
Figure 2C:
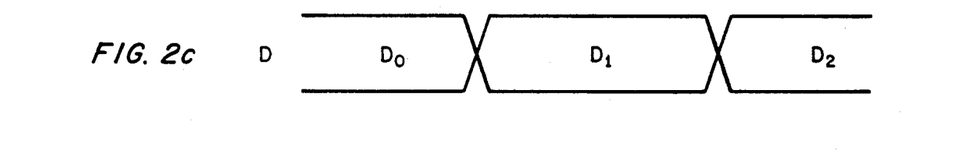
Figure 2D:
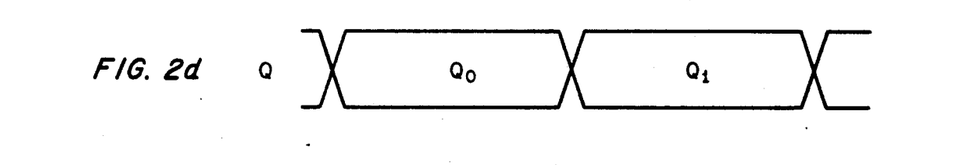

In FIG. 1, signals $\phi1$, $\bar{\phi}1$, $\phi2$, $\bar{\phi}2$ to be sent to the transfer gates TG1 to TG4 are clock signals, and $\phi1$ and $\phi2$ of clock signals are complementary clock signals which are not overlapped relative to each other as shown in FIGS. 2a and 2d. Signal $\bar{\phi}1$ is a negative of signal $\phi1$ and signal $\bar{\phi}2$ is a negative of signal $\phi2$. The data input signal is impressed on the inverter IV1 through the transfer gate TG1 when signal $\phi1$ is at its high level as shown in FIG. 2a, taken in a master flip-flop (consisting of the inverters IV1 and IV2) by the trailing edge of signal $\phi1$, and is separated from the input terminal D, being held. This held data signal is outputted from the data output terminal Q at a rising edge of $\phi2$ immediately after the trailing edge of signal $\phi1$ through the third inverter IV3, as well as held in the slave flip-flop (consisting of the inverters IV3 and IV4).

According to the master-slave type flip-flop of the conventional CMOS structure mentioned-above, when the potential of the data output terminal Q is translated from the VDD potential to GND and signal $\phi2$ becomes a VDD potential, a current flows from the VDD terminal of the first inverter IV1 to the input of the third inverter IV3 through two P channel MOS transistors MP32 of the first inverter IV1 and MP35 of the third transfer gate, so that gate terminals of both transistors MP36 and MN36 of the third inverter IV3 are charged.

When the gate terminals of MP36 and MN36 are charged and their potentials are translated from the GND potential to VDD one, a current flows from the output terminal Q to the GND terminal of the third inverter IV3 through the N channel MOS transistor of MN36, whereby the potential of the output terminal Q is translated from the VDD potential to GND one. Additionally, when the clock signal $\phi2$ becomes VDD, an electric charge at the gate terminals of transistors MP36 and MN36 of the third inverter IV3 moves and a current flows to the GND terminal of the first inverter IV1 through two N channel MOS transistors and MN35 and MN32, so that the potential at the gate terminals of MP36 and MN36 is translated from the VDD potential to GND. As a result, a current flows from the VDD source to the output terminal Q via MP36 and the potential at the output terminal Q is translated from GND potential to VDD.

Potential translation time length of the output terminal Q between GND potential and VDD one is determined according to easiness of respective currents to flow. Carriers of the N channel and the P channel transistors are an electron and a positive hole, respectively. Therefore, current it is more difficult for current to flow through a P channel MOS transistor than a N channel MOS transistor and the former transistor has a longer rising time. In particular, in case there are a plurality of P channel MOS transistors in a route of current flowing from the VDD terminal, the rising time lengthens very much.

In the flip-flop shown in FIG. 1, there are two P channel MOS transistors MP32 and MP35 in a current route from the VDD terminal to the gate terminals of the transistors MP36 and MN36 of the third inverter IV3, so that the rising time of the gate terminals of MP36 and MN36 is very long. Consequently trailing time of the output terminal Q lengthens disadvantageously very much.

SUMMARY OF THE INVENTION

Consequently, it is the purpose of the present invention to provide a master-slave type flip-flop having a CMOS structure of a short operative time.

It is another purpose of the present invention to provide a master-slave type flip-flop of a CMOS structure having no P channel transistor between a master flip-flop and a slave flip-flop.

According to the present invention, a flip-flop circuit comprises a first flip-flop circuit of a CMOS structure, a second flip-flop circuit of a CMOS structure, a pair of first transfer gates of an N channel MOS transistor for connecting a pair of input-output nodes of the first flip-flop circuit, respectively to a pair of input-output nodes of the second flip-flop, a pair of second transfer gates of an N channel MOS transistor, respectively for connecting a pair of input-output nodes of the first flip-flop circuit to truth and complementary data input terminals, means for connecting a pair of input-output nodes of the second flip-flop circuit, respectively to truth and complementary data output terminals, means for activating the second flip-flop circuit according to the first clock signal, and means for activating the first flip-flop circuit according to the second clock signal, wherein the second transfer gate pair is turned ON according to the first clock signal and the first transfer gate pair is turned ON according to the second clock signal.

According a concrete embodiment of the present invention, the first N channel MOS transistor is connected between one of the truth and complementary data input terminal pair and the first node, the second N channel MOS transistor is connected between another one of the data input terminal pair and the second node, gate terminals of the first and the second N channel MOS transistors are connected to the first clock input terminal, the third N channel MOS transistor is connected between a GND terminal and the third node, a gate terminal of the third N channel MOS transistor is connected to the second clock input terminal, the fourth N channel MOS transistor is connected between the first node and the third node, a gate terminal of the fourth N channel MOS transistor is connected to the second node, the fifth N channel MOS transistor is connected between the second node and the third node, a gate terminal of the fifth N channel MOS transistor is connected to the first node, the first and the second P channel MOS transistors, respectively are connected between the VDD terminal and the first and the second P channel MOS transistor, a gate terminal of the second P channel MOS transistor is connected to the second and the first nodes respectively, the sixth and the seventh N channel MOS transistors, respectively are connected between the first and the second nodes and one and another of truth and complementary data output terminals, gate terminals of both the sixth and the seventh N channel MOS transistor are connected to the second clock input terminal, the eighth N channel MOS transistor is connected between the fourth node and the GND terminal, a gate terminal of the eighth N channel MOS transistor is connected to the first clock input terminal, the ninth and the tenth N channel MOS transistors, respectively are connected between the node 4 and either data output terminal, gate terminals of the ninth and the tenth N channel MOS transistors, respectively are connected to one and other data output terminals, the third and the fourth P channel MOS transistors are connected between the VDD terminal and either data output terminal, and gate terminals of the third and the fourth P channel MOS transistors are connected to each data output terminal, wherein the first clock signal and the second clock signal are not overlapped.

According to the another embodiment of the present invention, the flip-flop circuit has the first and the second data input terminals first and second data output terminals, first and second clock input terminals, first and second reset input terminals, first and second set input terminals, 18 N channel MOS transistors of first--eighteenth, and 4 P channel MOS transistors of first-fourth, in which flip-flop circuit the first data input terminal is connected to a source terminal of the first N channel MOS transistor, said second data input terminal is connected to a source terminal of the second N channel MOS transistor, gate terminals of the first and the second N channel MOS transistors are connected to said first clock input terminal, a source terminal of the third N channel MOS transistor is connected to a ground potential terminal and a gate terminal of the third N channel MOS transistor is to a clock input terminal, source terminals of said fourth and the fifth N channel MOS transistors are connected to a drain terminal of the third N channel MOS transistor and a gate terminal of these fourth and fifth N channel MOS transistors are connected to drain terminals of the fourteenth and the thirteenth N channel MOS transistors and their drain terminals are connected to drain terminals of said thirteenth and the fourteenth N channel MOS transistors, source terminals of the first and the second P channel MOS transistors are connected to the VDD terminal and their gate terminal are connected to these drain terminals of the fourteenth and the thirteenth N channel MOS transistors and their drain terminals are connected to drain terminals of said thirteenth and the fourteenth N channel MOS transistors, source terminals of the seventh and the seventh N channel MOS transistors are connected to the thirteenth and the fourteenth N channel MOS transistors and their gate terminals are connected to the second clock input terminal and their drain terminals are connected to the first and the second data output terminals, a source terminal of the eighth N channel MOS transistor is connected to said ground potential terminal and its gate terminal is connected to the first clock input terminal, source terminals of the ninth and the tenth N channel MOS transistors are connected to a drain terminal of the eighth N channel MOS transistor and their gate terminals are connected to drain terminals of the seventh and the sixth N channel MOS transistor and their drain terminals are connected to drain terminals of the sixth and the seventh N channel MOS transistors, source terminals of the third and the fourth P channel MOS transistors are connected to the VDD terminals and their gate terminals are connected to the drain terminals of the seventh and the sixth N channel MOS transistors and their drain terminals are connected to drain terminals of the sixth and the seventh N channel MOS transistors, source terminals of the eleventh and the twelfth N channel MOS transistors are connected to drain terminals of the first and the second N channel MOS transistors and their drain terminals are connected to source terminals of the thirteenth and the fourteenth N channel MOS transistors, source terminals of the fifteenth and sixteenth N channel MOS transistors are connected to said ground potential terminals and their drain terminals are connected to drain terminals of the thirteenth and the sixth N channel MOS transistors, and source terminals of the seventeenth and the eighteenth N channel MOS transistors are connected to said ground potential terminals and their drain terminals are connected to drain terminals of the fourteenth and the seven N channel MOS transistors, the first reset input terminal is connected to the gate terminals of the fifteenth and the seventeenth N channel MOS transistors, the second reset input terminal having a negative condition of the first reset input terminal are connected to gate terminals of the thirteenth and the fourteenth N channel MOS transistors, the first set input terminals are connected to gate terminals of the seventeenth and the eighteenth N channel MOS transistors, the second set input terminal having a negative value of the condition of the first set input terminal is connected to gate terminals of the eleventh and the twelfth N channel MOS transistor, a negative logic of the first data input terminal becomes an input signal of the second data input terminal and non-overlapped clock signals are inputted to the first clock input terminal and the second clock input terminal.

According to the second embodiment of the present invention, it is possible to delete the first and the second set input terminals and the eleventh, the twelfth, the seventeenth and the eighteenth N channel MOS transistors, the drain terminal of the first N channel MOS transistor is connected to the source terminal of the thirteenth N channel MOS transistor, and the drain terminal of the second N channel MOS transistor is connected to the source terminal of the fourteenth N channel MOS transistor.

BRIEF DESCRIPTION OF THE DRAWINGS

The above and other objects, features and advantages of the present invention will become apparent from the following detailed description when taken with accompanying drawings in which.

Figure 3:
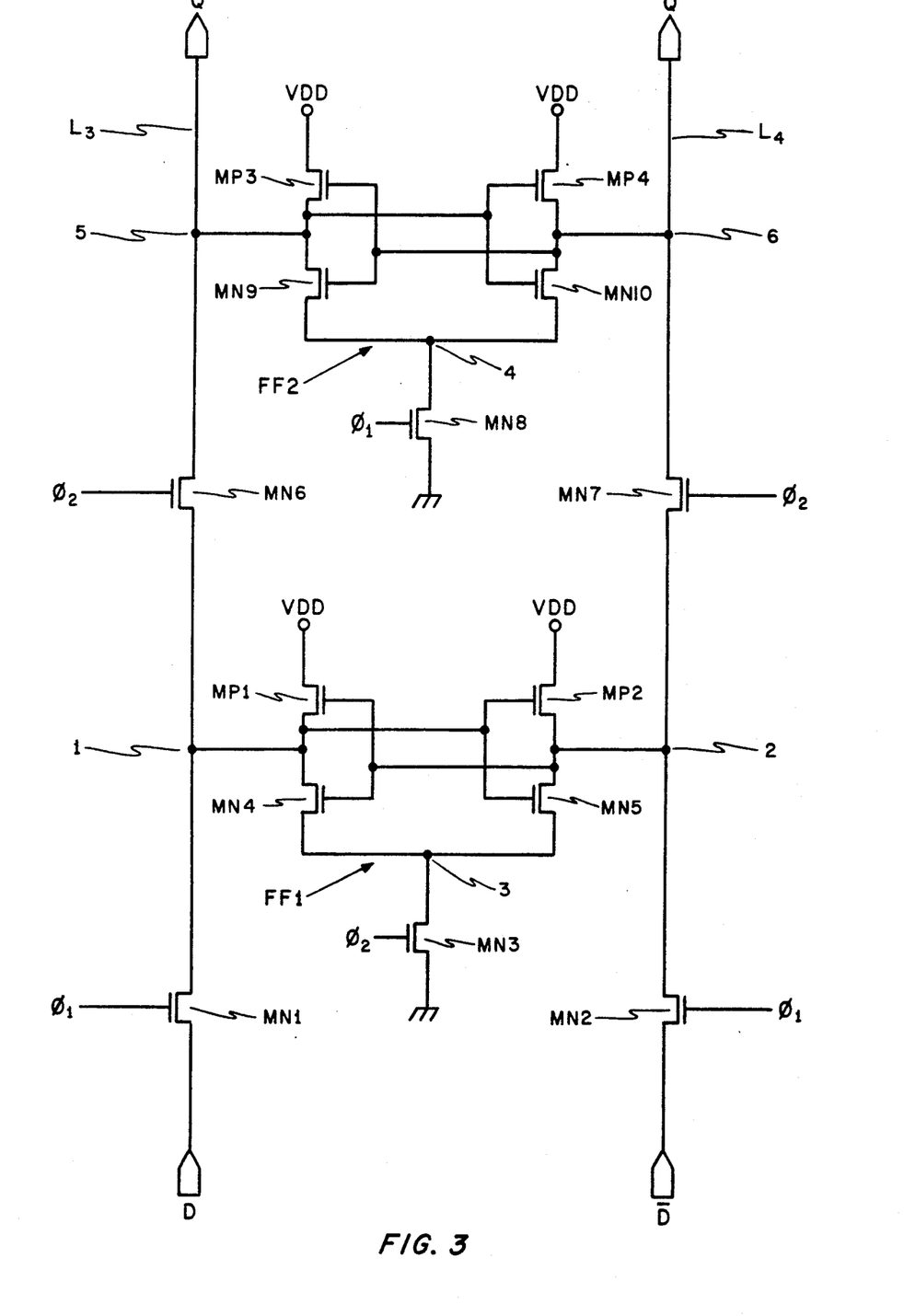
FIG. 3 shows a circuit chart of an embodiment according to the present invention.

DESCRIPTION OF THE PREFERRED EMBODIMENTS as shown in FIG. 3 depicting the circuit of one embodiment of the present invention, data input terminals D and $\overline{D}$ are provided for data signals. The data input terminal $\overline{D}$ receives an input data signal having negative potential of the input data signal which is supplied to the terminal D. Output terminals Q and $\overline{Q}$ function as output terminals for data signals. An output data signal from the terminal $\overline{Q}$ has negative potential of an output data signal from the terminal Q. $\phi 1$ and $\phi 2$ are complemental clock signals not being overlapped as shown in FIGS. 2a and 2b. N channel MOS transistors MN1 and MN2 constituting a transfer gate have gate terminals are connected to a clock signal $\phi 1$ and source terminals of the transistors MN1 and MN2 are connected to data input terminals D and $\overline{D}$, respectively. The gate terminals of N channel MOS transistors MN6 and MN7 of the transfer gate connected between input/output nodes 1 and 2 of a master flip-flop FF1 and input/output nodes 5 and 6 of a slave flip-flop FF2, respectively are connected to the clock signal $\phi 2$, source terminals of these MOS transistors MN6 and MN7 are connected to the drain terminals of MN1 and MN2, and their drain terminals are connected to the output terminals Q, $\overline{Q}$. Gate terminals of N channel MOS transistors MN3 and MN8 for activating respective flip-flop FF1 and FF2 are connected to the clock signals $\phi 2$ and $\phi 1$, their source terminals are connected to GND terminals, and their drain terminals to nodes 3 and 4.

Source terminals of P channel MOS transistors MP1 and MP2 are connected to the VDD terminal, their gate terminals are to the nodes 2 and 1, and their drain terminals to the nodes 1 and 2. N channel MOS transistors MN4 and MN5 are connected between the nodes 1, 2 and the node 3 and their gate terminals are connected to the node 2 and node 1. While P channel MOS transistors MP3 and MP4 are connected between the VDD terminal and the nodes 5 and 6, and N channel transistors MN9 and MN10 are connected between the connecting points 5 and 6 and the node 4. The gate terminals of MN9 and MP3 are connected to the output terminal $\overline{Q}$ and the gate terminals of MN10 and MP4 are to Q.

The operation of the master-slave type flip-flop having such struction above will be explained.

When the clock signal $\phi 1$ has its VDD potential, the input signals supplied to the terminals D and $\overline{D}$ have a VDD potential and GND potential, respectively, and the clock signal $\phi 2$ is at a GND potential making MN3, MN6, and MN7 of OFF condition and MN1 and MN2 of ON condition. Consequently, the flip-flop FF1 becomes a non-active condition, and the nodes 1 and 2 are separated from these output terminals Q, $\overline{Q}$ and connected to the input terminals D, $\overline{D}$. Then, the node 1 is going to be translated to VDD potential and the node 2 is to be translated to GND potential. Consequently, MP1 becomes of ON condition and MP2 becomes of OFF condition, so that finally the node 1 becomes VDD potential and the node 2 becomes GND potential. Next, when the clock signal $\phi 1$ becomes GND potential and the signal $\phi 2$ becomes VDD potential, MN1 and MN2 become OFF condition and MN3 becomes ON condition. When MN3 turns to ON, the flip-flop FF1 is activated. Because a node 1 of the flip-flop FF1 is of VDD potential and a node 2 is of GND potential, MP1 and MN5 become ON condition and MP2, MN4 become OFF condition keeping the potential condition of the nodes 1 and 2. That is, the input data signals at a $\phi 1$ trailing edge are held in the master flip-flop FF1.

The explanation above is done on the basis that an input signal supplied to the terminals D and $\overline{D}$ have respectively VDD potential and GND potential, and apparently the same explanation can be used when the terminal D is of GND potential and the terminal $\overline{D}$ is of VDD potential, contrarily.

The part consisting of MN1 to MN5, MP1 and MP2, respectively described above is a master portion of a flip-flop of a master-slave type according to the present invention, and another part of MN6 to MN10, MP3 and MP4 is a slave portion of the flip-flop.

On the slave portion, it is made by exchanging $\phi 1$ and $\phi 2$ to each other having the same operation as the master portion. Consequently, when $\phi 2$ is translated to the VDD potential, the potentials of the nodes 1 and 2 are transferred to the output terminals Q and $\overline{Q}$. Additionally, when $\phi 1$ is of the VDD potential, the potential of the slave portion is kept as it is.

As described above, according to the particular circuitry structure shown in FIG. 3, these data signals to be inputted as shown in the timing chart of FIG. 2c are taken in when $\phi 1$ trails and they are held in the flip-flop of the master-slave type according to the present invention and data signals are outputted on the instant of a rising of $\phi 2$. Hereinafter, rising times and trailing times of the output signals will be explained. When the output signal from the output terminal Q is translated from the VDD potential to the GND potential, current flows to the GND terminal through N channel MOS transistors MN6, MN4 and MN3. At that time, the potential of the terminal $\overline{Q}$ is transferred from GND to VDD because the output terminal Q is translated or changed to the GND potential, the P channel MOS transistors MP4 turns to ON condition, and $\overline{Q}$ is changed to of the VDD potential. In case that the output signal outputted from the terminal Q is translated from GND potential to VDD potential, the VDD potential of the output terminal $\overline{Q}$ is discharged through N channel MOS transistors MN7, MN5 and MN3 and becomes GND potential, thus the P channel MOS transistor MP3 is turned ON and Q becomes VDD potential. It is noted that only one P channel MOS transistor is existed in the current route governing the rise time and the trail time of the potentials of the output terminals Q, $\overline{Q}$. Consequently, it is possible to shorten the rise time and the trail time of the flip-flop of the master-slave system according to the present invention than the conventional flip-flop of the known master-slave type.

Another circuit of different embodiment according to the present invention will be described with reference to FIG. 4.

Similar to the embodiment shown in FIG. 3, input terminals D and $\overline{D}$ are input terminals of data signal. The data input terminal $\overline{D}$ receives an input data signal having negative potential of the input data signal which is supplied to the terminal D. The output terminals Q, $\overline{Q}$ are output terminals for data signal. An output data signal from the terminal $\overline{Q}$ has negative potential of an output data signal from the terminal Q. $\phi 1$ and $\phi 2$ are supplemental clock signals which are not overlapped to each other as shown in FIGS. 2a and 2b.

The gate terminals of N channel MOS transistors MN1 and MN2 are connected to a clock signal $\phi 1$ and these source terminals of these transistors above, respectively are connected to the data input terminals D, $\overline{D}$. Gate terminals of N channel MOS transistors MN6 and MN7 are connected to the clock signal $\phi 2$, source terminals of them are connected to the drain terminals of MN1 and MN2 through transistors MN13, MN11 and MN14, MN12, and their drain terminals are connected to the output terminals Q, $\overline{Q}$, respectively.

The gate terminals of N channel MOS transistors MN3 and MN8 are connected to the clock signals $\phi 2$, $\phi 1$ and their source terminals are connected to GND terminals.

The source terminals of P channel MOS transistors MP, MP2, MP3 and MP4 are connected to the VDD terminal, gate terminals of these transistors are connected to drain terminals of MN14, MN13, MN7 and MN6, and drain terminals of these transistors are connected to drain terminals of MN13, MN14, MN6 and MN7, respectively.

Source terminals of the N channel MOS transistors MN4, MN5, MN9 and MN10 are connected to the drain terminals of MN3, MN3, MN8 and MN8, gate terminals of these transistors are connected to drain terminals of MN14, MN13, MN7 and MN6, and their drain terminals are to drain terminals of MN13, MN14, MN6 and MN7, respectively.

Figure 4:
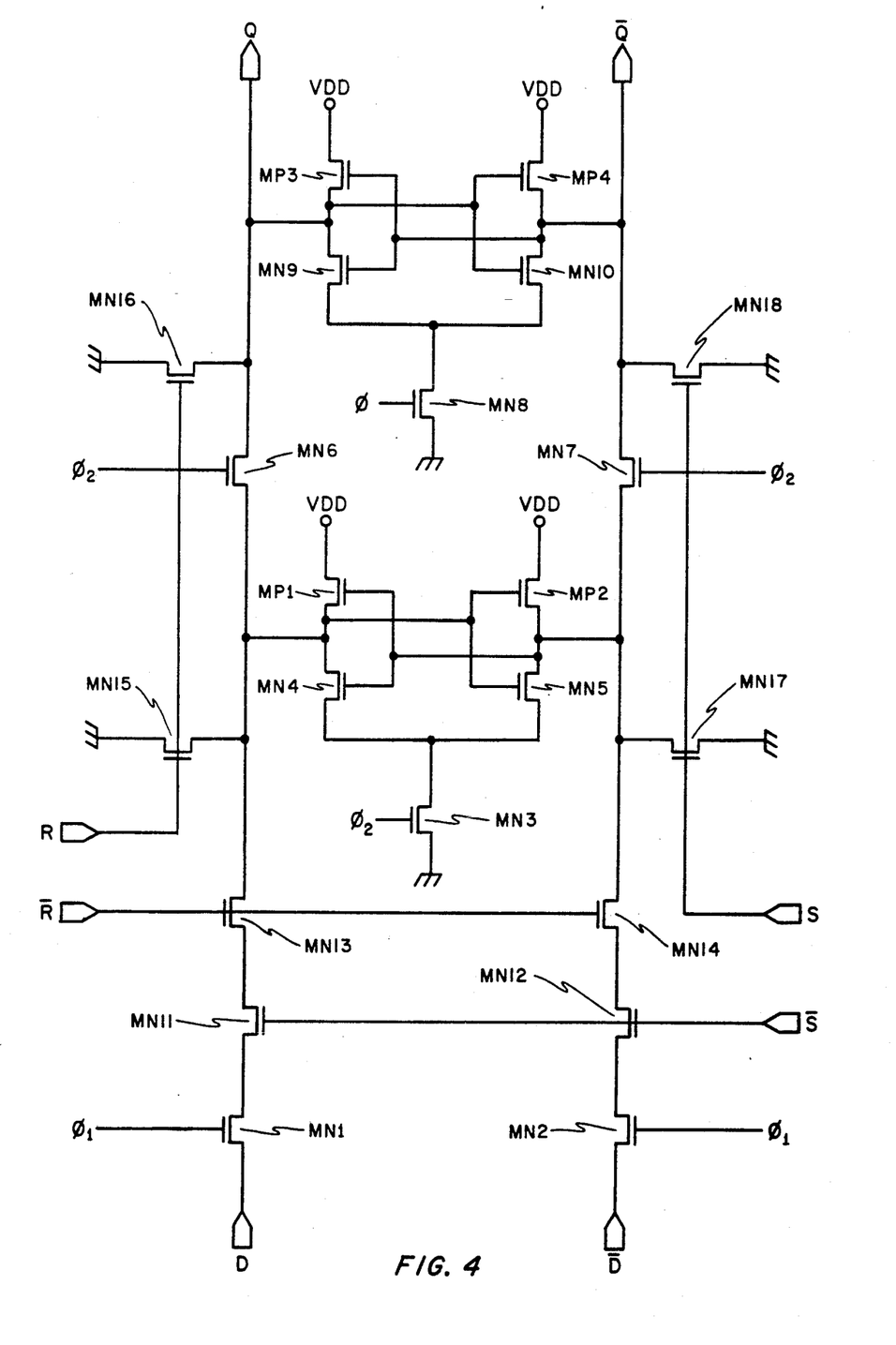
FIGS. 4 and 5 are circuit diagrams of other embodiments according to the present invention.

Terminal $\overline{R}$ in FIG. 4 is a reset input terminal and an input thereto of GND potential turns the data output signal Q to zero, independently of the clock signals and the data signals. Terminal $\overline{S}$ in FIG. 4 is a set input terminal and an input thereto of VDD potential turns the data output signal Q to 1, independently of the clock signals and the data signals.

Potentials of terminals $\overline{R}$ and $\overline{S}$ are invert to the potentials of the terminals R and S, respectively.

Next, an operation of the embodiment shown in FIG. 4 and constructed as described above will be described.

When the clock signal $\phi 1$ has a VDD potential, the input signals from the terminals D and $\overline{D}$ have a VDD potential and a GND potential, the terminals R and S have VDD potential, and $\overline{R}$ and $\overline{S}$ have GND potential, the clock signal $\phi 2$ has the GND potential and MN3, MN6 and MN7 are at their OFF condition. Then, the drain terminals of MN1, MN13 are going to have VDD potential and the drain terminals of MN2, MN14 are going to have GND potential. As a result, MP1 becomes ON condition and MP2 turns to OFF condition, finally the drain terminals of MN13 become of VDD potential and drain terminals of MN14 become GND potential.

Next, when the clock signal $\phi 1$ becomes GND potential and the signal $\phi 2$ becomes VDD potential, MN1, MN2 become OFF condition and MN3 becomes ON condition. When MN3 turns to ON, MP1, MP5 and MN3 turn to ON and MP2 and MN4 turn to OFF since the drain terminal of MN13 is of VDD potential and drain terminal of MN14 is of GND potential, and their potential conditions are held. That is, the input data signals D, $\overline{D}$ obtained at a trail time of $\phi 1$ are held.

The explanation above concerns the case in which the input signals supplied to the terminals D and $\overline{D}$ have VDD and GND potential, respectively, however the same explanation will be applied to the reversed case.

The master portion of the flip-flop circuit of a master-slave type according to the embodiment consists of MN1 to MN5, MN11 to MN15, MN17, MP1 and MP2 as described above, and the slave portion of the circuit consists of the remaining MN6 to MN10, MN16, MN18, MP3 and MP4.

The slave portion is constructed by exchanging $\phi 1$ and $\phi 2$ of the master portion and functions in the same manner as that of master portion. Consequently, When $\phi 2$ is translated to have VDD potential, potentials of the output terminals Q, $\overline{Q}$ are translated. Additionally, when $\phi 1$ is of VDD potential, the potential of the slave portion is kept.

As described above, according to the particular circuitry structure shown in FIG. 3, the data signals are taken in when $\phi 1$ trails as shown in the timing chart of FIG. 2c and held as they are and data signals are outputted when $\phi 2$ rises.

In case that the potentials of reset terminals R and $\overline{R}$ are of VDD and GND potential, MN15 and MN16 become ON condition and MN13 turns to OFF, so a source terminal and drain terminal of MN6 are apt to become GND potential. Then, MP2 and MP4 turn to ON condition, a source terminal and drain terminal of MN7 and a gate terminal of MP1, MP3 become to have VDD potential, MP1 and MP3 turn to OFF, keeping these potential conditions. Consequently, outputs from the output terminals Q and $\overline{Q}$ become GND potential and VDD potential, being reset.

In case that the potentials of the terminals S and $\overline{S}$ are of VDD potential and GND potential, respectively, the outputs of the terminals Q and $\overline{Q}$ become VDD potential and GND potential, respectively, and thus being set, in the manner similar to the above mentioned case of reset.

Here, rise times and trail times of the output signals will be explained.

When a potential of the output terminal Q is translated from VDD to GND, a current flows to the GND terminal through N channel MOS transistors MN6, MN4 and MN3. Meanwhile, the potential of the output terminal $\overline{Q}$ is translated from GND potential to VDD potential because that the potential of the output terminal Q is translated to GND potential, the P channel MOS transistor MP4 turns to ON, and the potential of $\overline{Q}$ is translated to VDD potential.

The explanation above can be applied to the case in which the potential of Q changes from the GND potential to the VDD potential after the contents of the explanation is reversed, obtaining the same operation as above.

As described above, only one P channel MOS transistor is existent in the route of the current governing the rise time and the trail time of these output terminals Q, $\overline{Q}$. As a result, the rise time and the trail time in the embodiment shown in FIG. 4 are shorter notably than that of the flip-flop of the conventional master-slave type or system shown in FIG. 1.

Figure 5:
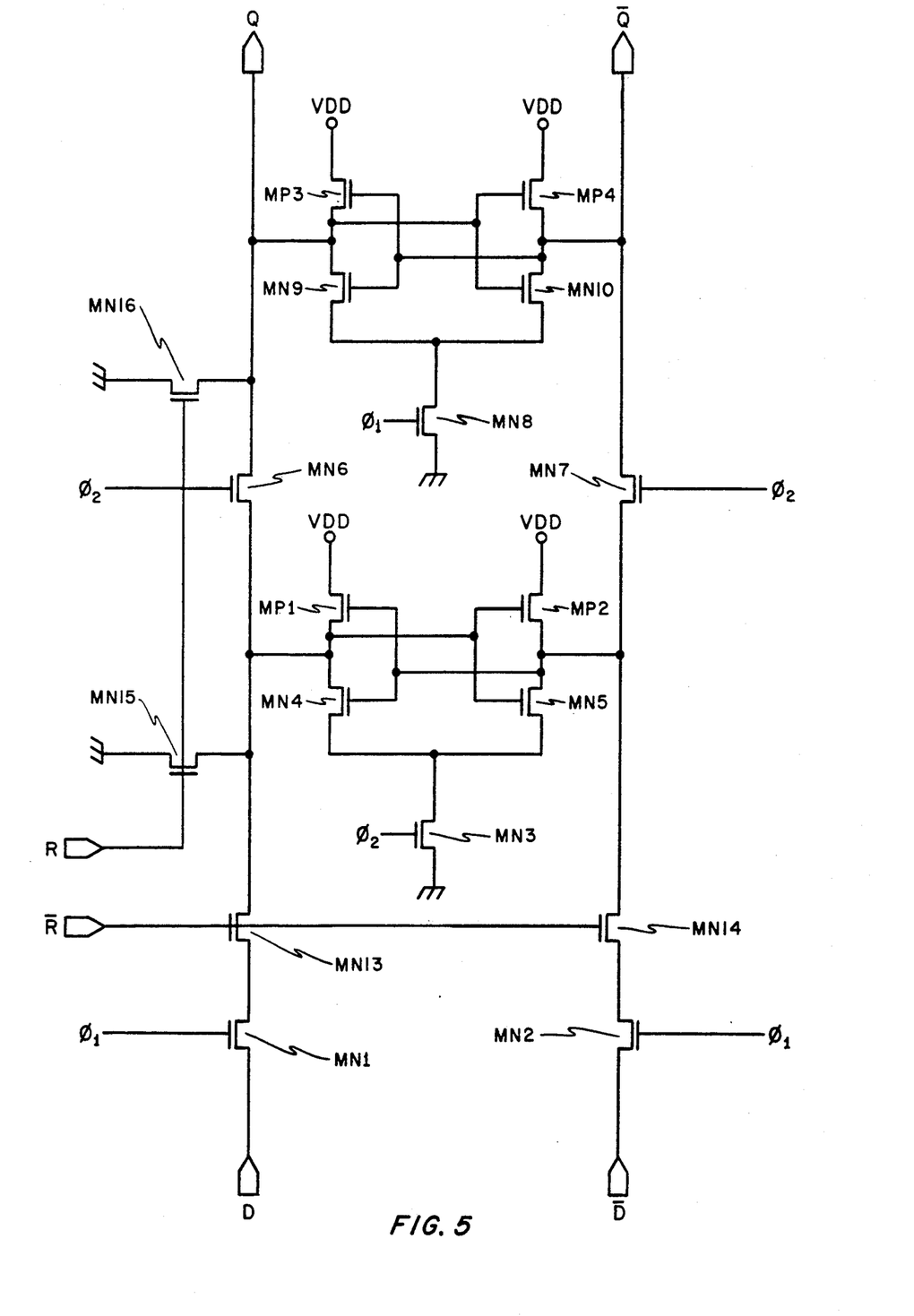

FIG. 5 is a circuit chart of still another embodiment according to the present invention.

According to the embodiment of FIG. 5, it is constructed by employing the structure of the embodiment shown in FIG. 4 after removing elements related to the data set operation such as the N channel transistors MN11, MN12, MN17 and MN18 and the set input terminals S and $\overline{S}$. On its operation, it is identical with that of the embodiment of FIG. 4 except that an asynchronous data set operation can not be carried out.

It is apparent from the description above that only one P channel MOS transistor exists in the route of the current governing or controlling rise times and trail times of output signals according to the flip-flop circuit of the master-slave type of the present invention, so these times of rise and trail of output signals are shortened.

In consequence, the flip-flop circuit of the present invention has an effect of a high speed operation of the circuit.

What is claimed is:

1. A flip-flop circuit comprising a first flip-flop circuit of a CMOS structure, a second flip-flop circuit of a CMOS structure, a pair of first transfer gates each formed of an N channel MOS transistor for connecting a pair of input-output nodes of the first flip-flop circuit, respectively to a pair of input-output nodes of the second flip-flop, a pair of second transfer gates each formed of an N channel MOS transistor, respectively for connecting a pair of input-output nodes of the first flip-flop circuit to a truth terminal and to a complementary data input terminal, means for connecting a pair of input-output nodes of the second flip-flop circuit to a truth terminal and a complimentary data output terminal, means for activating the second flip-flop circuit in response to a first clock signal, and means for activating the first flip-flop circuit in response to a second clock signal, wherein the second transfer gate pair is turned ON in response to the first clock signal and the first transfer gate pair is turned ON in response to the second clock signal.

2. The flip-flop circuit according to claim 1, further comprising a reset gate of an N channel MOS transistor which may be connected to input-output nodes at truth sides of said first flip-flop circuit and said second flip-flop circuit, or to a set gate of an N channel MOS transistor connected to input-output nodes at complement sides of the first flip-flop circuit and said second flip-flop circuit, or to both said reset gate and the set gate.

3. A slip-flop of a master-slave type comprising first and second data input terminals first to fifth nodes, first and second output terminals, first and second clock input terminals, first to tenth N channel MOS transistors, first to fourth P channel MOS transistors, wherein the first N channel MOS transistor is connected between one of a plurality of truth and complementary data input terminal pairs and the first node, the second N channel MOS transistor is connected between another one of the truth and complementary data input terminal pairs and the second node, gate terminals of the first and the second N channel MOS transistors are connected to the first clock input terminal, the third N channel MOS transistor is connected between a GND terminal and the third node, a gate terminal of the third N channel MOS transistor is connected to the second clock input terminal, the fourth N channel MOS transistor is connected between the first node and the third node, a gate terminal of the fourth N channel MOS transistor is connected to the second node, the fifth N channel MOS transistor is connected between the second node and the third node, a voltage source having a VDD terminal and a ground terminal GND, a gate terminal of the fifth N channel MOS transistor is connected to the first node, the first and the second P channel MOS transistors, respectively are connected between the VDD terminal and the first and the second P channel MOS transistor, a gate terminal of the second P channel MOS transistor is connected to the second and the first nodes respectively, the sixth and the seventh N channel MOS transistor, respectively are connected between the first and the second nodes and one and another of truth and complementary data output terminals, gate terminals of both the sixth and the seventh N channel MOS transistors are connected to the second clock input terminal, the eighth N channel MOS transistor is connected between the fourth node and GND terminal, a gate terminal of the eighth N channel MOS transistor is connected to the first clock input terminal, the ninth and the tenth N channel MOS transistors, respectively are connected between the fourth node and either data output terminal, date terminals of the ninth and tenth N channel MOS transistors, respectively are connected to one and another data output terminals, the third and fourth P channel MOS transistors are connected between the VDD terminal and either data output terminal, and gate terminals of the third and the fourth P channel MOS transistors are connected to each data output terminal, wherein the first clock signal and the second clock signal are not overlapped.

4. A flip-flop circuit comprising a power source having VDD and ground terminals, first and second data input terminals, first and second data output terminals, first and second clock input terminals, first and second reset input terminals, first and second set input terminals, first through eighteenth N channel MOS transistors, each of said transistors having source, drain, and gate terminals, and first through fourth P channel MOS transistors, a flip-flop circuit having the first data input terminal connected to a source terminal of the first N channel MOS transistor, said second data input terminal connected to a source terminal of the second N channel MOS transistor, gate terminals of the first and the second N channel MOS transistors connected to said first clock input terminal, a source terminal of the third N channel MOS transistor connected to a ground potential terminal and a gate terminal of the third N channel MOS transistor connected to a clock input terminal, source terminals of said fourth and fifth N channel MOS transistors connected to a drain terminal of the third N channel MOS transistor and a gate terminal of the fourth and fifth N channel MOS transistors connected to drain terminals of the fourteenth and the thirteenth N channel MOS transistors, the drain terminals of the fourth and fifth channel N channel MOS transistors connected to drain terminals of said thirteenth and the fourteenth N channel MOS transistors, source terminals of the first and the second P channel MOS transistors connected to the VDD terminal and gate terminal of the first and second P channel MOS transistors connected to the drain terminals of the fourteenth and the thirteenth N channel MOS transistors, and drain terminals of the first and second P channel MOS transistors connected to drain terminals of said thirteenth and the fourteenth N channel MOS transistors, source terminals of the sixth and the seventh N channel MOS transistors connected to the thirteenth and the fourteenth N channel MOS transistors and gate terminals of the sixth and seventh N channel MOS transistors connected to the second clock input terminal and drain terminals of the sixth and seventh N channel MOS transistors connected to the first and the second data output terminals, a source terminal of the eighth N channel MOS transistor connected to said ground potential terminal and the gate terminal of the eighth N channel MOS transistor connected to the first clock input terminal, source terminals of the ninth and the tenth N channel MOS transistors connected to a drain terminal of the eighth N channel MOS transistor and the gate terminals of the ninth and tenth N channel MOS transistors connected to drain terminals of the seventh and the sixth N channel MOS transistors and the drain terminals of the ninth and tenth N channel MOS transistors connected to drain terminals of the sixth and the seventh N channel MOS transistors, source terminals of the third and the fourth P channel MOS transistors connected to the VDD terminals and the gate terminals of the third and fourth P channel MOS transistors connected to the drain terminals of the seventh and the sixth N channel MOS transistors and the drain terminals of the third and fourth P channel MOS transistors connected to drain terminals of the sixth and the seventh N channel MOS transistors, source terminals of the eleventh and twelfth N channel MOS transistors connected to drain terminals of the first and the second N channel MOS transistors and the drain terminals of the eleventh and twelfth N channel MOS transistors connected to source terminals of the thirteenth and the fourteenth N channel MOS transistors, source terminals of the fifteenth and sixteenth N channel MOS transistors connected to said ground potential terminals and the drain terminals of the fifteenth and sixteenth N channel MOS transistors connected to drain terminals of the thirteenth and the sixth N channel MOS transistors, and source terminals of the seventeenth and the eighteenth N channel MOS transistors connected to said ground potential terminal and the drain terminals of the seventeenth and eighteenth N channel MOS transistors connected to drain terminals of the fourteenth and the seven N channel MOS transistors; the first reset input terminal being connected to the gate terminals of the fifteenth and the seventeenth N channel MOS transistors, the second reset input terminal having a negative value condition of the first reset input terminal being connected to gate terminals of said thirteenth and fourteenth N channel MOS transistors, said first set input terminal being connected to the gate terminal of said seventeenth and said eighteenth N channel MOS transistors, the second set input terminal having a negative value condition of the first set input terminal and being connected to the gate terminal of said eleventh and the twelfth N channel MOS transistors, a negative logic of said first data input terminal, and non-overlapped clock signals being inputted to said first clock input terminal and the second clock input terminal.

5. The flip-flop circuit according to claim 4, wherein said first and the second set input terminals and the eleventh, the twelfth, the seventeenth, and the eighteenth N channel MOS transistors are outside the flip-flop circuit according to claim 4, the drain terminal of said first N channel MOS transistor is connected to the source terminal of the thirteenth N channel MOS transistor, and the drain terminal of the second N channel MOS transistor is connected to the source terminal of the fourteenth N channel MOS transistor.

* * * * *